US008279763B2

(12) United States Patent
Rozum et al.

(10) Patent No.: US 8,279,763 B2
(45) Date of Patent: Oct. 2, 2012

(54) SYSTEM AND METHOD FOR GROUPING TRAFFIC EVENTS

(75) Inventors: Timothy C. Rozum, Olathe, KS (US); Scott J. Brunk, Edgerton, KS (US)

(73) Assignee: Garmin Switzerland GmbH (CH)

( * ) Notice: Subject to any disclaimer, the term of this patent is extended or adjusted under 35 U.S.C. 154(b) by 1666 days.

(21) Appl. No.: 11/549,016

(22) Filed: Oct. 12, 2006

(65) Prior Publication Data

US 2008/0088486 A1 Apr. 17, 2008

(51) Int. Cl.
*G01R 11/00* (2006.01)

(52) U.S. Cl. ...................... 370/252; 455/414.2; 701/451

(58) Field of Classification Search .................. 370/252; 455/414.2; 701/451
See application file for complete search history.

(56) References Cited

U.S. PATENT DOCUMENTS

| | | | | |
|---|---|---|---|---|
| 5,987,381 | A | 11/1999 | Oshizawa | 701/209 |
| 6,161,092 | A | 12/2000 | Latshaw et al. | 704/270 |
| 6,574,556 | B2 | 6/2003 | Fish et al. | |
| 6,728,628 | B2 | 4/2004 | Peterson | 701/117 |
| 7,027,915 | B2 | 4/2006 | Craine | |
| 7,069,143 | B2 | 6/2006 | Peterson | 701/117 |
| 7,609,172 | B2 | 10/2009 | Rozum et al. | 240/901 |
| 2003/0112156 | A1 | 6/2003 | Behr et al. | 340/995.2 |
| 2003/0216857 | A1 * | 11/2003 | Feldman et al. | 701/117 |
| 2004/0143385 | A1 | 7/2004 | Smyth et al. | 701/117 |
| 2005/0033504 | A1 * | 2/2005 | Rennels | 701/117 |
| 2005/0288856 | A1 * | 12/2005 | Uyeki et al. | 701/210 |
| 2006/0058940 | A1 | 3/2006 | Kumagai et al. | 701/117 |
| 2006/0089754 | A1 | 4/2006 | Mortenson | |
| 2007/0112504 | A1 * | 5/2007 | Krause et al. | 701/200 |

OTHER PUBLICATIONS

International Search Report from corresponding International Application No. PCT/US2007/080602, dated Apr. 23, 2009.
International Search Report from International Application No. PCT/US2007/080586, dated Apr. 23, 2009.
TMC Compendium Alert-C Coding Handbook, Trafficmaster, Jan. 2, 1999.
$YQ_2$ User Manual and Installation Instructions, Trafficmaster, 1998.
Printout from http a tomtom.com/products/product.php?ID=212 &Category=0&Lid=1, 4 pages, printed May 14, 2007.
NUVI 310/360 Owner's Manual; Garmin Ltd., Apr. 2006.
StreetPilot 2720 Owner's Manual; Garmin Ltd., Jun. 2005.
Chinese Office Action from Application CN 200780037998.0, dated May 11, 2010.

* cited by examiner

*Primary Examiner* — Sai-Ming Chan
(74) *Attorney, Agent, or Firm* — Samuel M. Korte; Mohammad M. Ali

(57) ABSTRACT

A device, system, and method for grouping traffic events. In one embodiment, the device comprises a traffic component, a computing device coupled with the traffic component, and a display coupled with the computing device. The traffic component is operable to receive data corresponding to a plurality of traffic events. The computing device is operable to identify at least two related traffic events and form a traffic event group representing at least two of the related traffic events. The display is operable to present an indication of the formed traffic event group. Such a configuration enables users to more easily access relevant traffic information.

18 Claims, 4 Drawing Sheets

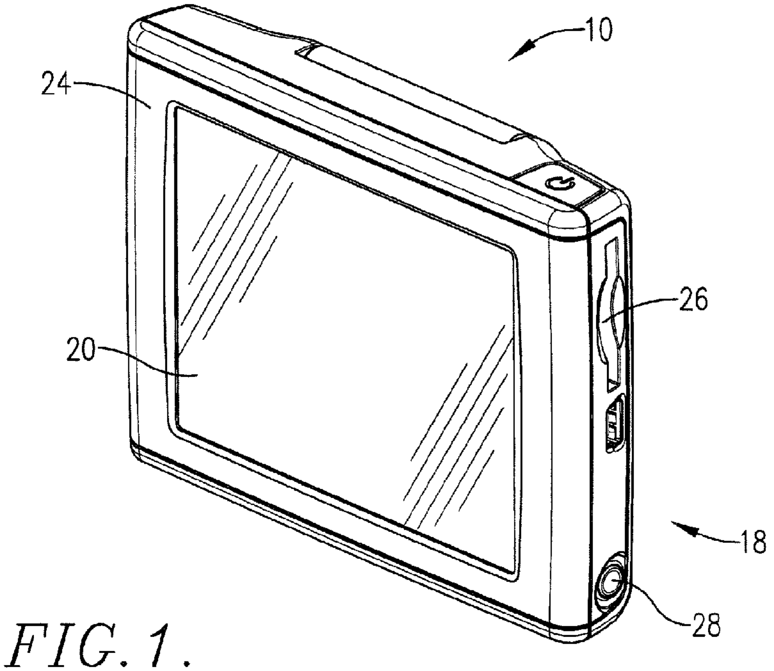
FIG. 1.
FIG. 2.
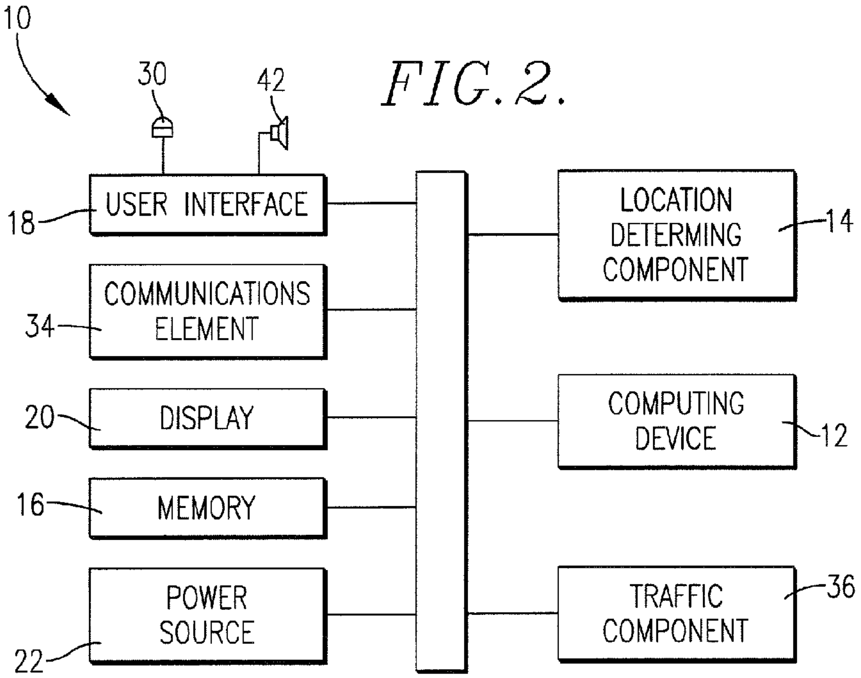

FIG. 3.
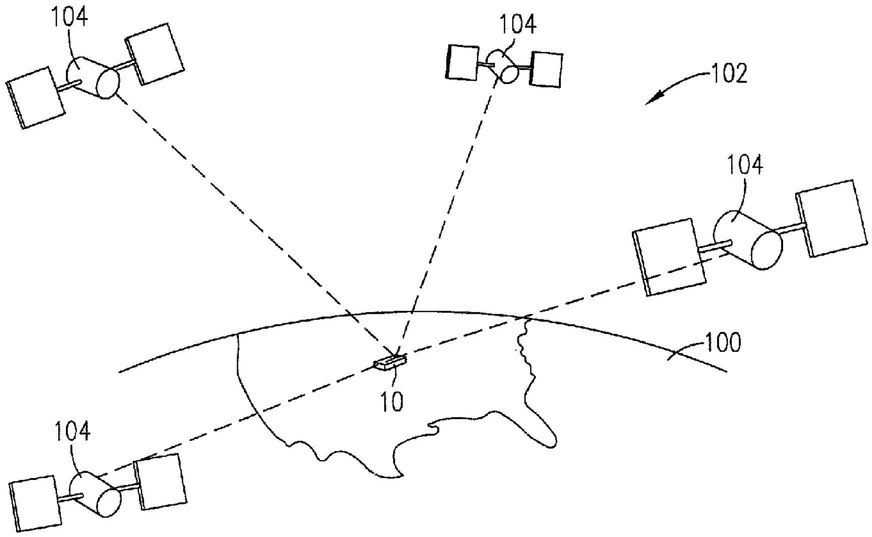
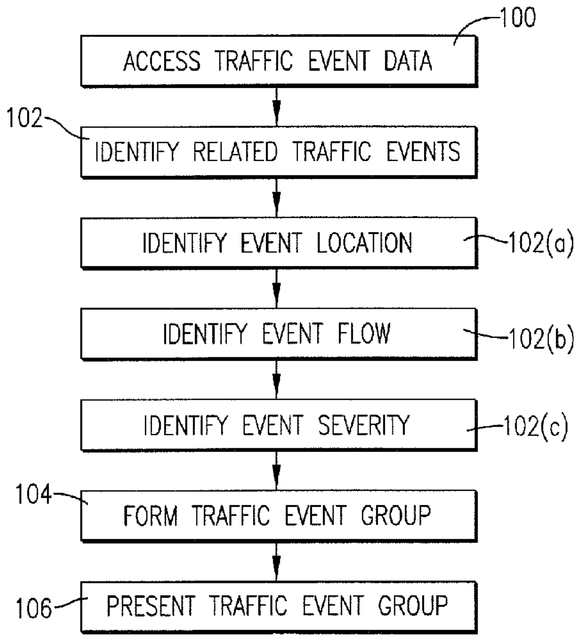
FIG. 4.

SYSTEM AND METHOD FOR GROUPING TRAFFIC EVENTS

BACKGROUND OF THE INVENTION

1. Field of the Invention

Embodiments of the present invention relate to devices, systems, and methods for grouping traffic events. More particularly, various embodiments of the invention group traffic events, such as delays resulting from road construction or car accidents, to enable simplified presentation to a user.

2. Description of the Related Art

Navigation devices are commonly employed in automobiles to calculate travel routes and provide guidance using the Global Positioning System (GPS). Due to the desire to acquire the most accurate information for route planning and guidance, navigation devices have been configured to wirelessly receive traffic information from various sources. The received traffic information may be provided to drivers to allow appropriate route compensation around traffic delays.

Traffic information services commonly report a single traffic event, such as a car accident, as a plurality of events due to the separate reception of traffic information or varying flow speeds associated with particular events. For example, a single car accident may be reported as both a traffic slowdown at a first location and a car accident at a second location that may be the same as the first location. Navigation devices in communication with the traffic information services would thus present the single car accident as two discrete events. Consequently, drivers are often notified of an overabundance of traffic events.

SUMMARY OF THE INVENTION

Embodiments of the present invention solve the above-described problems and provide a distinct advance in the art of traffic event notification. More particularly, various embodiments of the invention group traffic events, such as delays resulting from road construction or car accidents, to enable simplified presentation to a user. Such a configuration enables users to more easily access relevant traffic information.

In one embodiment, the present invention provides a device comprising a traffic component, a computing device coupled with the traffic component, and a display coupled with the computing device. The traffic component is operable to receive data corresponding to a plurality of traffic events. The computing device is operable to acquire a current geographic location of the device, identify at least two related traffic events, and form a traffic event group representing at least two of the related traffic events. The display is operable to present an indication of the traffic event group.

In another embodiment, the present invention provides a method for grouping traffic events. The method generally includes the steps of accessing data corresponding to a plurality of traffic events, identifying at least two related traffic events, forming a traffic event group representing at least two of the related traffic events, and presenting an indication of the traffic event group.

In another embodiment, the present invention provides a computer program for grouping traffic events. The computer program is stored on a computer-readable medium for operating a computing device and generally includes: a code segment operable to access data corresponding to a plurality of traffic events; a code segment operable to identify at least two related traffic events; a code segment operable to form a traffic event group representing at least two of the related traffic events; and a code segment operable to present an indication of the traffic event group.

In another embodiment, the present invention provides a system that generally comprises a computing element and a navigation device. The computing element is generally operable to access data corresponding to a plurality of traffic events, identify at least two related traffic events, form a traffic event group representing at least two of the related traffic events, and transmit data corresponding to the formed traffic event group. The navigation device includes a display and is generally operable to receive the data corresponding to the formed traffic event group and present an indication of the traffic event group on the display.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein:

FIG. 1 is a isometric view of a navigation device configured in accordance with various preferred embodiments of the present invention;

FIG. 2 is a block diagram of certain components of the navigation device of FIG. 1;

FIG. 3 is schematic diagram of a Global Positioning System (GPS) that may be utilized by various embodiments of the present invention;

FIG. 4 is a flow chart showing some of the steps that may be performed by various embodiments of the present invention;

Figure 5:
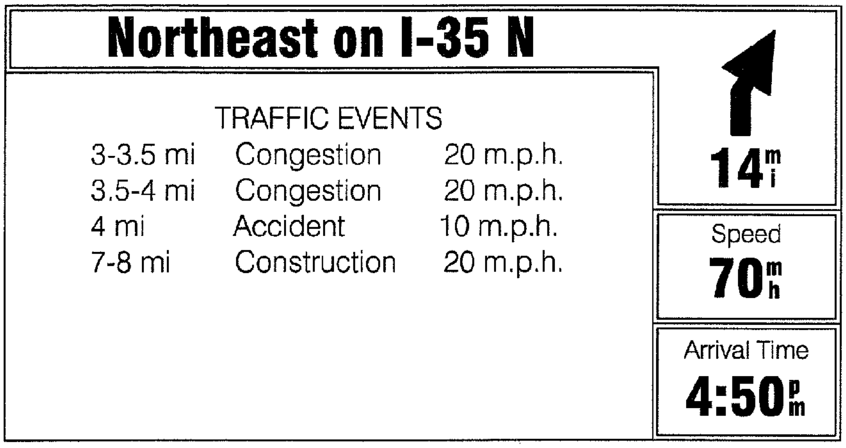
FIG. 5 is a sample screen display showing a prior art listing of traffic events.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

As shown in FIGS. 1-2, embodiments of the present invention are preferably implemented utilizing an electronic device 10. The device 10 may be any electronic device or system operable to receive, utilize, or otherwise determine geographic information, such as a current geographic location or traffic information associated with a location. Thus, the device 10 may include computers, televisions, radios, portable computing devices such as laptops or personal data assistants (PDAs), cellular telephones, portable entertainment devices, etc. More preferably, the device 10 is a navigation device manufactured by GARMIN INTERNATIONAL, INC. of Olathe, Kans. However, the device 10 may be any device configured as described herein or otherwise operable to perform the functions described below.

The device 10 preferably includes a computing device 12, a location determining component 14 coupled with the computing device 12 to facilitate determination of a current geographic location, a memory 16 coupled with the computing device 12 and operable to store information, a user interface 18 coupled with the computing device 12 and operable to communicate with a user, a display 20 and power source 22 each coupled with the computing device 12, and a housing 24 for housing the various components of the device 10.

The computing device 12 is preferably coupled with the user interface 18, location determining component 14, memory 16, and display 20, through wired or wireless connections, such as a data bus, to enable information to be exchanged between the various elements.

The computing device 12 may comprise various computing elements, such as integrated circuits, microcontrollers, microprocessors, programmable logic devices, discrete logic components, application specific integrated circuits, etc, alone or in combination, to perform the operations described herein. Further, the computing device 12 is preferably operable to control the various functions of the device 10 according to a computer program, including one or more code segments, or other instructions associated with the memory 16 or with various processor logic and structure.

The computer program may comprise a plurality of code segments arranged as ordered listing of executable instructions for implementing logical functions in the computing device 12. The computer program can be embodied in any computer-readable medium, including the memory 16, for use by or in connection with an instruction execution system, apparatus, or device, such as a computer-based system, processor-containing system, or other system that can fetch the instructions from the instruction execution system, apparatus, or device, and execute the instructions. In the context of this application, a "computer-readable medium" can be any means that can contain, store, communicate, propagate or transport the program for use by or in connection with the instruction execution system, apparatus, or device. The computer-readable medium can be, for example, but not limited to, an electronic, magnetic, optical, electromagnetic, infrared, or semi-conductor system, apparatus, device, or propagation medium. More specific, although not inclusive, examples of the computer-readable medium would include the following: an electrical connection having one or more wires, a portable computer diskette, a random access memory (RAM), a read-only memory (ROM), an erasable, programmable, read-only memory (EPROM or Flash memory), an optical fiber, a compact disc (CD), a digital video disc (DVD), combinations thereof, etc. The computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in the memory 16.

As described below in more detail, the computing device 12 is preferably operable to determine a current geographic location of the device 10 by receiving the geographic location from the location determining component 14 or from another device through the user interface 18. Alternatively, the computing device 12 may independently determine geographic locations based on information and/or data, such as received navigation signals, provided by the location determining component 14, stored within the memory 16, or acquired from other devices or elements.

The location determining component 14 is preferably a Global Positioning System (GPS) receiver, and is adapted to provide, in a substantially conventional manner, geographic location information for the device 10. The location determining component 14 may be, for example, a GPS receiver much like those disclosed in U.S. Pat. No. 6,434,485, which is incorporated herein by specific reference. However, the location determining component 14 may receive cellular or other positioning signals utilizing various methods to facilitate determination of geographic locations without being limited to GPS.

The GPS is a satellite-based radio navigation system that allows determination of navigation information, such as position, velocity, time, and direction, for an unlimited number of users. Formally known as NAVSTAR, the GPS incorporates a plurality of satellites that orbit the earth.

The location determining component 14 scans for GPS satellite signals and, upon receiving signals from at least three different satellite signals, the location determining component 14 utilizes the three satellite signals to determine its own position. Acquiring a fourth satellite signal will allow the location determining component 14 to calculate its three-dimensional position by the same calculations. As should be appreciated, the computing device 12 may be operable to perform one or more of these functions in place of the location determining component 14.

Although GPS enabled devices are often used to describe navigation devices, it will be appreciated that satellites need not be used to determine a geographic position of a receiving unit since any receiving device capable of receiving signals from multiple transmitting locations can perform basic triangulation calculations to determine the relative position of the receiving device with respect to the transmitting locations. For example, cellular towers or any customized transmitting radio frequency towers can be used instead of satellites. With such a configuration, any standard geometric triangulation algorithm can be used to determine the exact location of the receiving unit.

FIG. 3 shows one representative view of a GPS denoted generally by reference numeral 102. A plurality of satellites 104 are in orbit about the Earth 100. The orbit of each satellite is not necessarily synchronous with the orbits of other satellites and, in fact, is likely asynchronous. The navigation device 10, including the location determining component 14, is shown receiving spread spectrum GPS satellite signals from the various satellites 104.

The location determining component 14 may also include various processing and memory elements to determine the geographic location of the device 10 itself or it may provide information to the computing device 12 to enable the computing device 12 to specifically determine the geographic location of the device 10. Thus, the location determining component 14 need not itself calculate the current geographic location of the device 10 based upon received signals. The location determining component 14 also may include an antenna for receiving signals, such as a GPS patch antenna or helical antenna.

Further, the location determining component 14 may be integral with the computing device 12 and/or memory 16 such that the location determining component 14 may be operable to specifically perform the various functions described herein. Thus, the computing device 12 and location determining component 14 need not be separate or otherwise discrete elements.

In various embodiments the location determining component 14 does not directly determine the current geographic location of the device 10. For instance, the location determining component 14 may determine the current geographic location utilizing the user interface 18, such as by receiving location information from the user, through the communications network, from another electronic device, etc.

The memory 16 is coupled with the computing device 12 and/or other device 10 elements and is operable to store various data utilized by the computing device 12 and/or other elements. The memory 16 may include removable and non-removable memory elements such as RAM, ROM, flash, magnetic, optical, USB memory devices, and/or other conventional memory elements.

Further, the memory 16 may comprise a portion of the user interface 18 to enable the user to provide information to the device 10 via the memory 16, such as by inserting a removable memory element into a slot 26 to provide information and instruction to the device 10. The memory 16 may also be integral with the computing device 12, such as in embodiments where the memory 16 comprises internal cache memory.

The memory 16 may store various data associated with operation of the device 10, such as a computer program, code segments, or other data for instructing the computing device 12 and other device 10 elements to perform the steps described below. Further, the memory 16 may store various cartographic data corresponding to geographic locations including map data, and map elements, such as thoroughfares, terrain, alert locations, points of interest, geographic entities, traffic information and events, and other navigation data to facilitate the various navigation functions provided by the device 10. Additionally, the memory 16 may store destination addresses and previously calculated or otherwise acquired routes to various destination addresses for later retrieval by the computing device 12.

Further, the various data stored within the memory 16 may be associated within a database to facilitate computing device 12 retrieval of information. For example, the database may be configured to enable the computing device 12 to retrieve geographic locations, geographic entities, and traffic information based upon a current geographic location of the device 10, as is discussed at length below.

The user interface 18 enables users, third parties, or other devices to share information with the device 10. The user interface 18 is generally associated with the housing 24, such as by physical connection through wires, etc, or wirelessly utilizing conventional wireless protocols. Thus, the user interface 18 need not be physically coupled with the housing 24.

The user interface 18 may comprise one or more functionable inputs 28 such as buttons, switches, scroll wheels, etc, a touch screen associated with the display 20, voice recognition elements such as a microphone 30, pointing devices such as mice, touchpads, trackballs, styluses, a camera such as a digital or film still or video camera, combinations thereof, etc. Further, the user interface 18 may comprise wired or wireless data transfer elements such as removable memory including the memory 16, data transceivers, etc, to enable the user and other devices or parties to remotely interface with the device 10.

In some embodiments, the user interface 18 may include a communications element 34 to enable the device 10 to communicate with other computing devices, navigation devices, and any other network enabled devices through a communication network, such as the Internet, a local area network, a wide area network, an ad hoc or peer to peer network, or a direct connection such as a USB, Firewire, or Bluetooth connection, etc. Similarly, the user interface 18 may be configured to allow direct communication between similarly configured navigation devices, such that the device 10 need not necessarily utilize the communications network to share geographic location or traffic information.

In various embodiments the communications element 34 may enable the device 10 to wirelessly communicate with communications networks utilizing wireless data transfer methods such as WiFi (802.11), Wi-Max, Bluetooth, ultra-wideband, infrared, cellular telephony, radio frequency, etc. However, the communications element 34 may couple with the communications network utilizing wired connections, such as an Ethernet cable, and is not limited to wireless methods.

The user interface 18 is preferably operable to provide various information to the user utilizing the display 20 or other visual or audio elements such as a speaker. Thus, the user interface 18 enables the user and device 10 to exchange information relating to the device 10, including traffic information and events, geographic entities, configuration, security information, preferences, route information, points of interests, alerts and alert notification, navigation information, waypoints, traffic information, a destination address, etc.

The display 20 is coupled with the computing device 12 and/or other device 10 elements and is operable to display various information corresponding to the device 10, such as traffic information and events, maps, locations, and security information as is described below. The display 20 may comprise conventional black and white, monochrome, or color display elements including CRT, TFT, and LCD devices. Preferably, the display 20 is of sufficient size to enable the user to easily view the display 20 to receive presented information while in transit.

Further, as described above, the display 20 may comprise a portion of the user interface 18, such as in embodiments where the display 20 is a touch-screen display to enable the user to interact with the display 20 by touching or pointing at display areas to provide information to the device 10.

In some embodiments, the display 20 mounted separately from the traffic component, discussed below, and the computing device 12. Thus, the device 10 may provide an input or other connector for removable coupling with an external display, such that the device 10 does not necessarily include the display 20.

The power source 22 is associated with the housing 24 to provide electrical power to various device 10 elements. For example, the power source 22 is preferably directly or indirectly coupled with the user interface 18, location determining component 14, computing device 12, memory 16, and/or display 20. The power source 22 may comprise conventional power supply elements, such as batteries, battery packs, etc. The power source 22 may also comprise power conduits, connectors, and receptacles operable to receive batteries, battery connectors, or power cables. For example, the power source 22 may include both a battery to enable portable operation and a power input for receiving power from an external source such an automobile.

The housing 24 is preferably handheld or otherwise portable to facilitate transport of the device 10 between locations. In some embodiments, the housing 24 may be configured for mounting within or on an automobile in a generally conventional manner and may comprise generally conventional and durable materials, such as ABS, plastics, metals, etc, to protect the enclosed and associated elements.

In some embodiments, the device 10 may lack the location determining component 14 and portable housing 24. Thus, in some embodiments the device 10 may comprise personal computers, desktop computers, servers, computing networks, personal digital assistants, laptops, cellular phones, portable entertainment and media devices, combinations thereof, etc., configured to perform one or more of the steps discussed below. For instance, the device 10 may comprise a server operable to execute a computer program or code segment to perform one or more of the below steps or portions thereof.

Preferably, the device 10 additionally includes a traffic component 36 operable to receive traffic information from external sources. The traffic component 36 may be integral with the user interface 18, such as in embodiments were the traffic component 36 is integrated with the communications element 34. The traffic component 36 may include wired or wireless receiver components, such as those discussed above regarding the communications element 34, to receive traffic information from external sources such as other similarly configured navigation devices, computers and computing devices, computing and broadcast networks, etc.

In various embodiments, the traffic component 36 may comprise radio-frequency (RF) receivers, optical receivers, infrared receivers, wireless fidelity (WiFi) devices, ultra wideband (UWB) devices, short-range wireless devices such as Bluetooth and Zigbee compatible devices, Global System for Mobile (GSM) communication devices, Code Division Multiple Access (CDMA) devices, Worldwide Interoperability for Microwave Access (Wi-Max) devices, other 802.11 compliant devices, satellite radio devices such as XM or SIRIUS receivers, combinations thereof, etc.

Preferably, the traffic component 36 is operable to receive frequency modulated (FM) signals. Thus, in some embodiments the traffic component 36 may include a FM receiver including or operable for coupling with an antenna to receive FM radio signals. However, in other embodiments, the traffic component 36 may be operable for coupling with a conventional FM receiver and antenna, such as by including an interface for coupling with a generally conventional automobile radio system, a satellite radio system, or an external radio receiver and antenna.

Preferably, the traffic component 36 is operable to receive and/or process traffic information, such as Traffic Message Channel (TMC) formatted information. Traffic information, such as road conditions, weather conditions, accident locations, areas of congestion, etc, may be provided as TMC formatted information and broadcast over conventional FM frequencies, or through satellite radio, for reception by various devices.

In order to broadcast TMC formatted information and associated data without interfering with audio transmissions, TMC formatted information is typically digitally encoded for transmission utilizing Radio Data System (RDS) and/or Radio Broadcast Data System (RDBS) information. As utilized herein, "RDS signal" refers to both RDS and RDBS signals, as RDS and RDBS are often used interchangeably by those skilled in the art.

Thus, the traffic component 36 is preferably operable to receive or otherwise acquire a FM-RDS signal including TMC formatted information. The traffic component 36 may include an integral processor, such as a TEA5764 FM radio with RDS and RBDS demodulation and decoding, distributed by PHILIPS SEMICONDUCTORS, or be operable to provide data and information to the computing device 12 for RDS and TMC decoding.

The traffic component 36 and/or computing device 12 are preferably operable to demodulate and/or decode the received FM-RDS signal to extract or otherwise generate TMC formatted information. The TMC formatted information may include data such as event codes, location codes, extent, direction, and duration to indicate incident and flow information.

Additionally or alternatively, in some embodiments the traffic component 36 may receive TMC formatted information, including event codes and location codes, or any other traffic information, without decoding or receiving FM or FM-RDS signals as the traffic component 36 may be operable to receive traffic information and data using other methods.

In some embodiments the received traffic information need not correspond to TMC formatted information. As discussed above, the traffic component 36 is operable to receive data and information from various sources, including computing networks and satellite radio broadcasts. Thus, the traffic component 36 may be operable to receive XM Radio formatted traffic information, MSN Direct formatted traffic information, and/or any other type of traffic information and data, in addition to, or instead of, TMC formatted traffic information.

Figure 9:
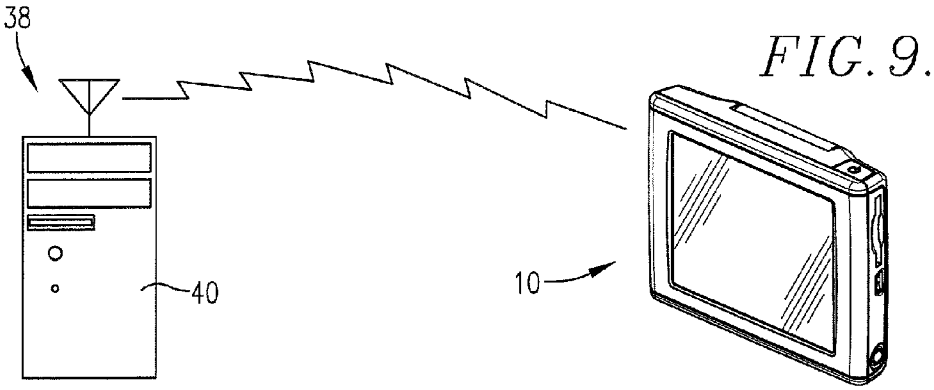
FIG. 9 is a block diagram showing a system provided by various embodiments of the present invention.

As shown in FIG. 9, embodiments of the present invention may also provide a system 38 comprising the device 10 and a computing element 40 operable to communicate with the device 10 using wired or wireless methods, such as by broadcasting radio frequency signals, transmitting information through the Internet or a LAN, broadcasting information to a wireless network, providing information to a communications network, or the like.

The computing element 40 may comprise computing devices such as personal computers, servers, computing networks, distributed computing devices, portable computing devices, combinations thereof, etc. The computing element 40 is preferably operable to wirelessly communicate with the device 10, such as by broadcasting or transmitting traffic information for reception by the traffic component 36, as discussed above. In some embodiments, the computing element 40 may include or be coupled with an FM transmitter, a satellite radio transmitter, or other wireless transmitters, to facilitate communication with the device 10. However, the computing element 40 may provide traffic information to the device 10 utilizing any data transfer or communication method.

FIG. 4 generally illustrates various methods which may be performed by embodiments of the present invention. Steps 100-106 generally include: accessing traffic event data, referenced at step 100; identifying at least two related traffic events, referenced at step 102; forming a traffic event group, referenced at step 104; and presenting the traffic event group, referenced at step 106.

In step 100, traffic event data is accessed. The accessed traffic event data preferably corresponds to a plurality of traffic events and includes information corresponding to the location and nature of each event. The accessed traffic event data may correspond to any information that indicates traffic conditions. Thus, as discussed above, the accessed traffic event data may include TMC formatted information including event codes, location codes, extent, direction, and duration to indicate incident and flow information.

In various embodiments, the traffic event data is accessed by wirelessly receiving the data. For instance, as discussed above, the traffic event data may be received by the traffic component 36 utilizing FM-RDS and/or satellite radio services. Similarly, the traffic event data may be retrieved from computing devices such as the computing element 40, navigation devices, and/or computing networks, such as the Internet or a LAN, using wired or wireless connections.

Additionally or alternatively, the traffic event data may be accessed by retrieving previously stored data from a memory, such as the memory 16 of the device 10. For instance, the memory 16 may store traffic event data, provided from any source, and the computing device 12 may access the memory 16 to retrieve stored traffic event data therefrom. Thus, in some embodiments, traffic event data may be wirelessly received utilizing the traffic component 36, stored within the memory 16, and then later accessed by the computing device 12. In other embodiments, the traffic event data may be manually or automatically entered into the memory 16 for storage using the user interface 18, such as in response to a reported traffic accident or delay, and then later accessed by the computing device 12 for processing as discussed below.

In embodiments comprising the system 38, the traffic event data may be accessed by the computing element 40 from its internal memory or from another external source, such as through a computing network. Further, the computing element 40 may access traffic event data through the manual entry of data by a user.

In step 102, at least two related traffic events are identified. As discussed above, traffic events are typically identified according to their location, extent, and flow. For instance, traffic information may include event and location codes to identify the location and flow of a traffic event.

Figure 7:
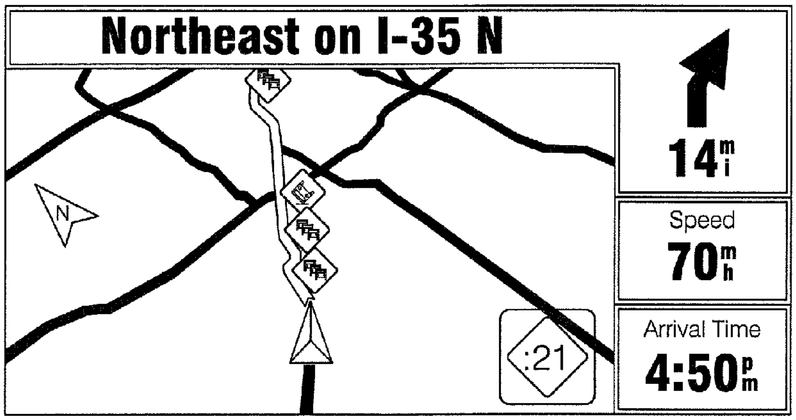
FIG. 7 is a sample screen display showing a prior art display of traffic events.

FIG. 5 provides an exemplary listing of traffic events as commonly provided by traffic information services. The exemplary listing of FIG. 5 shows a first traffic event, congestion, 3 miles ahead, having an extent of 0.5 miles, and a flow of 20 m.p.h. (i.e. an estimated speed through the area). The listing of FIG. 5 also shows three other traffic events and their associated locations and flows. FIG. 7 illustrates an exemplary screen display of each of these traffic events presented on a map.

As can be seen from FIGS. 5 and 7, the presentation of each of these traffic events may be overwhelming and confusing to the user, thereby inhibiting the user's ability to navigate and view displayed information. As should be appreciated by those skilled in the art, the number of traffic events for a given area is likely to be much greater than those listed in the exemplary figures, thereby further compounding user confusion.

However, by identifying traffic events that are related, such as traffic events that have a common source, embodiments of the present invention generally eliminate redundant and unnecessary traffic event notification. For instance, the computing device 12, and/or the computing element 40, may identify that several traffic events, such as the first three traffic events listed in FIG. 5, are related (such as to the car accident 4 miles ahead) by processing and/or analyzing the accessed traffic event data.

In some embodiments, such as those where the device 10 is a navigation device, it may be desirable to determine the current geographic location of the device 10 to facilitate identification of related traffic events. The current geographic location of the device 10 is preferably determined as described above utilizing the location determining component 14. Thus, for instance, the current geographic location may be determined in step 102 by receiving GPS signals and computing the current geographic location from the received GPS signals.

However, as is also described above, the current geographic location may be determined utilizing other methods, such as by retrieving the current geographic location from the memory 16, the user interface 18, and/or from another device such as the computing element 40. For example, the current geographic location may be determined by allowing the user to select his or her location from a map or listing presented by the display 20.

Related traffic events may be identified by analyzing or processing the traffic event data in any manner, include any combination of steps 102(*a*) through (*c*) discussed below.

In step 102(*a*), the locations of the traffic events corresponding to the accessed data are identified. As discussed above, the accessed data preferably includes geographic locations for each of the traffic events, such as TMC location codes. The location identified in step 102(*a*) may include the location where the traffic event begins, the location where the traffic event ends, the length or area occupied by the traffic event, the distance or range to the traffic event from the current geographic location of the device 10, the location of the traffic event on a portion of a route calculated by the computing device 12, the location of the traffic event on a road currently traveled by the device 10, combinations thereof, etc.

Utilizing the location of the traffic events, the computing device 12, and/or the computing element 40, may determine if the events are related. Specifically, traffic events having overlapping or sequential locations may be identified as related traffic events. For instance, the first three exemplary events listed in FIG. 5 may be identified as related due to the overlapping and sequential locations of each event. In some embodiments, related events may be grouped based upon their location alone, but location is preferably considered in combination with other factors to identify related traffic events.

Further, a distance threshold may be employed to group traffic events that are not necessarily adjacent or sequential. For instance, the computing device 12 may employ a distance threshold of 1 mile such that events within 1 mile of each other are grouped even if they are not adjacent to each other. Similarly, the distance threshold may be employed to prevent traffic events from being grouped if the distance between the events exceeds the distance threshold. Embodiments of the present invention may employ a plurality of distance thresholds, user-defined distance thresholds, and/or dynamically adjustable distance thresholds.

In step 102(*b*), the flow of each of the traffic events corresponding to the accessed data is identified. As discussed above, the flow of a traffic event generally corresponds to an estimated speed, or reduction in speed, encountered while traversing a traffic event. For example, the 20 mph flow corresponding to the first exemplary traffic event listed in FIG. 5 generally indicates that the expected speed is 20 mph while traversing the event. However, the flow identified in step 102(*b*) may correspond to any indication of the speed or rate of travel associated with a traffic event, and is not necessarily limited to the exemplary flows listed in FIG. 5.

Utilizing the identified flow of the traffic events, the computing device 12, and/or the computing element 40, may determine if the events are related. Specifically, events having similar flows may be identified as being related. Preferably, flow is used in combination with the locations identified in step 102(*a*) to facilitate accurate identification of related traffic events. For instance, traffic events having related locations, such as overlapping or sequential locations, and similar flows may be identified as related. Further, traffic events having related locations and dissimilar flows, such as the first three exemplary events provided in FIG. 5, may be identified as related with the event having the lowest flow being identified as the source of the related events. In some embodiments, related events may be grouped based upon their flow alone, but flow is preferably considered in combination with other factors to identify related traffic events.

In some embodiments, a flow threshold may be employed to facilitate event grouping. The flow threshold may indicate a minimum difference in flow required for two events to be grouped and/or a maximum difference in flow allowed for grouped events. For example, the computing device 12 may use the flow threshold to separate two events that appear otherwise related if the difference in flow between the two events exceeds the flow threshold.

In step 102(*c*), the severity of each of the traffic events corresponding to the accessed data is identified. The severity of each of the events may relate to the cause of the event, anticipated delay, associated traffic backlog, anticipated duration of the event, combinations thereof, etc. In some embodiments, the severity of an event may be the same as its flow, such that the lower the flow of a traffic event the more severe the event. Thus, by ranking the flow of a plurality of traffic events, the computing device 12 and/or the computing element 40 may determine the relative severity of each event. The computing device 12 is also operable to determine the severity of a group of events based on the average or worst severity of events within the group. However, in other embodiments the computing device 12 and/or computing element 40 may determine the severity of the events utilizing other criteria, including location, cause, nature, etc., such that the identified severity is not necessarily based only on flow. In some embodiments, the traffic data accessed in step 100 may include an indication of event severity, such as data indicating that an event is high, moderate, or low severity. Further, in some embodiments the accessed traffic data may include an indication of the severity of the events such that it is not necessary for the computing device 12 to determine severity.

Utilizing the severity of the traffic events, the computing device and/or the computing element 40 may determine if traffic events are related. For instance, the most severe traffic event in a collection of events is likely the cause or source of all events within the collection. Preferably, the severity of each of the traffic events is used in combination with their locations and/or flows to facilitate accurate identification of related events. For instance, related traffic events may be identified by organizing traffic events according to their location and then identifying which of the events within a particular range is most severe. For example, the first three exemplary events listed in FIG. 5 could be identified as being related based upon their proximate locations, the severity of the accident, and the lesser severity of the congestion. Thus, the first three events listed in FIG. 5 could be identified as being related and caused by the accident listed as the third event. Further, related traffic events may be identified by disregarding traffic events having low severity, thereby leaving only traffic events having moderate or high severity.

As should be appreciated, steps 102(*a*) through (*c*) are not necessarily each performed, as related traffic events may be identified through any method, including any combination of steps 102(*a*) through (*c*).

In step 104, at least one traffic event group is formed from the related traffic events identified in step 102. Preferably, related traffic events are grouped together in step 104 to reduce the number of traffic events that are presented to the user. Thus, in some embodiments, all related traffic events may be grouped together into a single traffic event group. For instance, the first three events listed in FIG. 5, identified as being related in step 102, may be grouped as a single traffic event group.

Figure 6:
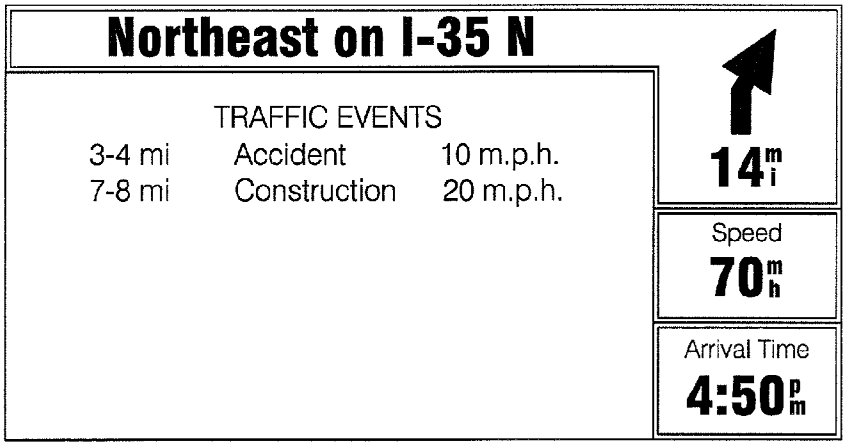
FIG. 6 is a sample screen display showing an exemplary listing of a traffic event group and traffic event provided by various embodiments of the present invention.

Preferably, the related traffic events are grouped according to the cause or source of the event grouping. More preferably, the related traffic events are grouped according to the most severe event among the related traffic events. For instance, the accident event listed in FIG. 5 may be identified as the most severe event of the first three related events and the resulting group could be formed to correspond to the accident. For instance, as shown in the example of FIG. 6, the first three events listed in FIG. 5 may be grouped into a single traffic event group corresponding to the traffic accident. Such grouping reduces driver confusion by presenting an accurate representation of traffic conditions, regardless of how the traffic data is originally presented.

In some embodiments, otherwise related traffic events may be excluded from a traffic event group based on their severity. For instance, traffic events with minimal severity, even when related to other more severe traffic events, may be excluded from the traffic event group to further reduce user confusion. Thus, for example, the first two events listed in FIG. 5 could be excluded from the group formed in step 104, even though the events are related to the accident event, due to their minimal severity in comparison to the accident event. Further, events having minimal severity may be ignored in step 102, thereby simplifying event grouping.

In situations where the severity of related events is generally similar, the related events may be grouped corresponding to the likely source of the events. For instance, if three traffic events are related based on their locations and all three events have the same severity, but one of the events is furthest from the current geographic location of the device 10, the three related events may be grouped corresponding to the event furthest from the current location. The locations used to group the traffic events may be a point-to-point distance or a distance as traveled along a road. However, embodiments of the present invention may employ any method operable to group a plurality of related traffic events, and need not be limited to grouping the events to correspond to the most severe event.

In situations where related traffic events have generally the same cause, such as construction or congestion, the group may be formed in step 104 to provide a generalized representation of the events. For example, a listing of three related congestion traffic events may be grouped into a single congestion traffic group having characteristics, such as location, flow, severity, etc, corresponding to an average or culmination of the characteristics of each traffic event within the group.

In some embodiments, the start and end position of a formed group may correspond to the closest and farthest locations of the traffic events within the group. In other embodiments, the start and end position of a formed group may correspond to locations other than the precise locations corresponding to the traffic events, such as where a portion of one of the events is disregarded or inaccurate when combined with other events. Thus, for example, a traffic event group may be formed to correspond to a car accident and the locations associated with the traffic event group may relate only to those associated with the accident, such that the locations corresponding to other events within the group may be given minimal or no weight.

In embodiments, where the device 10 is operable to calculate a route from its current location to a destination, the traffic event group may be formed only if at least one of the related traffic events is located on the calculated route. Thus, traffic events that are not positioned on the calculated route may be disregarded to conserve processing resources and limit user confusion. Similarly, traffic events not located or otherwise corresponding to a calculated route may be disregarded in step 102 and thus not identified for consideration in step 104.

Further, in some embodiments where a route has not been calculated, the traffic event group may be formed only if at least one of the related traffic events is on the same road currently being traveled by the device 10 and within a predetermined range, such as 10 or 20 miles. Thus, even when a route is not calculated, embodiments of the present invention are operable to limit presentation of only the most relevant traffic event groups. Similarly, traffic events not located on, or otherwise corresponding to, the currently traveled road within the predetermined range may be disregarded in step 102 and thus not identified for grouping consideration in step 104.

In step 106, the formed traffic event group is presented. Preferably, the formed traffic event group is presented to the user to facilitate navigation. Thus, in some embodiments the traffic event group may be presented by providing an indication of the traffic event group on the display 20. For example, the computing device 12 may instruct the display 20 to present a text description of the formed traffic event group, by itself or in combination with other traffic events and traffic event groups, as shown in FIG. 6. The text description may be presented in response to a functioning of the user interface 18 by the user or automatically when certain conditions are satisfied, such as the arrival of new traffic event data. The text description may include any information corresponding to the formed traffic event group, including its location and range, extent, cause, category, flow, severity, time delay, combinations thereof, etc.

Figure 8:
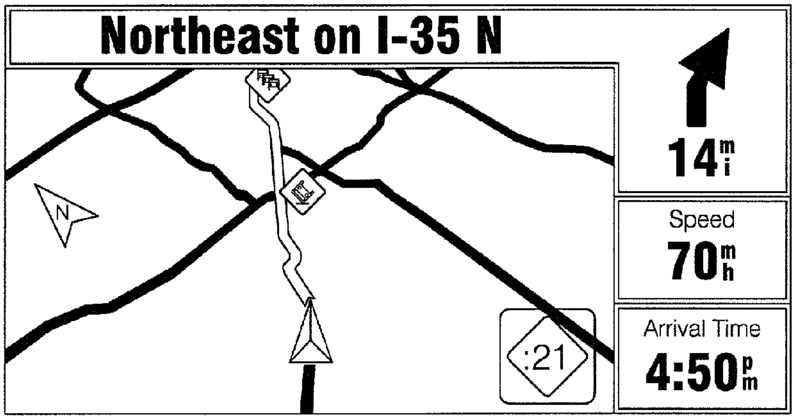
FIG. 8 is a sample screen display showing an exemplary display of a traffic event group and traffic event provided by various embodiments of the present invention.

Similarly, the indication of the formed traffic event group may be graphically presented on the display 20, such as on a map to facilitate user-identification and navigation. In embodiments where the device 10 is operable to determine its current geographic location, the formed traffic event group may be displayed in relation to the current geographic location of the device 10 as shown in FIG. 8. Thus, for example, the display 20 may present a map indicating both the current location of the device 10 and the location of the formed traffic event group and/or any other traffic events.

Further, the indication of the formed traffic event group may be audibly presented by the user interface 18, such as by generating audible sound using the speaker. For instance, in response to the formed traffic event group, the device 10 may present audible sound such as "Accident ahead, 3 miles," etc. Thus, in contrast to providing an audible alert for each traffic event, and thereby agitating or distracting the user, embodiments of the present invention are operable to present audible alerts for the traffic event group instead of for each of the individual events that comprise the group.

As can be seen in FIGS. 7 and 8, embodiments of the present invention substantially reduce the amount of information that must be consumed by the user by grouping related traffic events. For instance, the three related traffic events shown in FIG. 7, each corresponding to a car accident, are represented as a single traffic event group in FIG. 8, thereby limiting clutter on the displayed map while still presenting the user an accurate representation of traffic conditions.

In some embodiments, such as where the computing element 40 forms the traffic event group, the formed group may be presented by transmitting the formed traffic event group to a remote navigation device, such as the device 10. Thus, the formed traffic event group is not necessarily displayed to the user. For example, as shown in FIG. 9, the computing element 40 may access traffic event data (step 100), identify related events (step 102), form a traffic event group (step 104), and then transmit the formed traffic event group to the device 10. Upon reception of the formed traffic event group, the device 10 may store the group within the memory 16 or present it as discussed above.

Steps 100-106 are preferably repeated to provide current and accurate traffic information to the user. For example, traffic event data may be accessed at regular intervals, or accessed continuously, in step 100 to ensure that the most accurate information is used for traffic event group formation. Each time new traffic event data is received, or at any other interval, steps 102 and 104 may be performed to accurately identify related traffic events and form traffic event groups. Thus, embodiments of the present invention may be employed to form a plurality of traffic event groups from a plurality of traffic events. The formed traffic event groups may be continuously presented in step 106, or presented only at certain intervals or in response to functioning of the user interface 18.

As should be appreciated, steps 100-106 discussed above may be employed in addition to conventional navigation device features, such as route calculation, etc., to enable the device 10 to perform generally conventional navigation functions in addition to the functions performed by steps 100-106. Further, the device 10 may utilize the combination of navigation functions and traffic functions to calculate a route to a destination that avoids various traffic events and formed traffic event groups. Embodiments of the present invention simply route planning through the use of traffic event groups as the user and/or computing device 12 may avoid a plurality of traffic events by navigation around a single traffic event group.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A navigation device, comprising:

a location determining component to determine the current geographic location of the device;

a traffic component to receive data corresponding to a plurality of traffic events from one or more traffic information sources;

a computing device coupled with the traffic component and the location determining component, the computing device to acquire a current geographic location of the device from the location determining component, identify at least two related traffic events, and form a traffic event group representing at least two of the related traffic events; and a display coupled with the computing device, the display to present an indication of the traffic event group.

2. The device of claim 1, wherein the received data corresponding to the traffic events includes location information for each of the traffic events and the computing device compares the current geographic location of the device to the traffic event locations and forms the traffic event group if it includes at least one event location within a predetermined range from the current geographic location of the device.

3. The device of claim 1, wherein the indication of the traffic event group is displayed in relation to the current geographic location of the device.

4. The device of claim 1, wherein the computing device calculates a route from the current geographic location to a destination and forms the traffic event group if it includes at least one event located on the calculated route.

5. The device of claim 1, wherein the received data corresponding to the traffic events includes location information for each of the traffic events and the computing device identifies related traffic events according to the location information.

6. The device of claim 1, wherein the received data corresponding to the traffic events includes flow information for at least one of the traffic events and the computing device identifies related traffic events according to the flow information.

7. The device of claim 1, wherein the computing device determines a severity of each traffic event based upon the received data and identifies related traffic events according to their severity.

8. The device of claim 1, wherein the traffic component receives at least one of traffic message channel (TMC) formatted information, XM Radio formatted traffic information, and MSN Direct formatted traffic information.

9. The device of claim 1, wherein the computing device and traffic component are integral.

10. The device of claim 1, wherein the display is mounted separately from the traffic component and the computing device.

11. A method of grouping traffic events on a portable navigation device, the method comprising:

acquiring a current geographic location of a user using a location determining component associated with the portable navigation device;

accessing data corresponding to a plurality of traffic events using a traffic component associated with the portable navigation device;

identifying at least two related traffic events;

forming a traffic event group representing at least two of the related traffic events; and presenting an indication of the traffic event group on a display of the portable navigation device.

12. The method of claim 11, wherein the data corresponding to the plurality of traffic events is accessed by wirelessly receiving the data.

13. The method of claim 11, wherein the data corresponding to the plurality of traffic events is accessed by retrieving previously stored data from a memory.

14. The method of claim 11, wherein the accessed data corresponding to the traffic events includes location information for each of the traffic events and the related traffic events are identified according to the location information.

15. The method of claim 11, wherein the accessed data corresponding to the traffic events includes flow information for at least one of the traffic events and the related traffic events are identified according to the flow information.

16. The method of claim 11, further including identifying a severity of each traffic event based upon the received data and identifying related traffic events according to their severity.

17. The method of claim 11, wherein the accessed data includes at least one of traffic message channel (TMC) formatted information, XM Radio formatted traffic information, and MSN Direct formatted traffic information.

18. The method of claim 11, wherein the indication of the formed traffic event group is additionally presented audibly to the user.

* * * * *